United States Patent
Pfirsch et al.

(10) Patent No.: US 9,159,819 B2
(45) Date of Patent: Oct. 13, 2015

(54) SEMICONDUCTOR DEVICE AND RC-IGBT WITH ZONES DIRECTLY ADJOINING A REAR SIDE ELECTRODE

(71) Applicant: Infineon Technologies AG, Neubiberg (DE)

(72) Inventors: Frank Pfirsch, Munich (DE); Dorothea Werber, Munich (DE)

(73) Assignee: Infineon Technologies AG, Neubiberg (DE)

( * ) Notice: Subject to any disclaimer, the term of this patent is extended or adjusted under 35 U.S.C. 154(b) by 53 days.

(21) Appl. No.: 14/185,117

(22) Filed: Feb. 20, 2014

(65) Prior Publication Data

US 2015/0236143 A1   Aug. 20, 2015

(51) Int. Cl.

| | |
|---|---|
| H01L 29/06 | (2006.01) |
| H01L 29/739 | (2006.01) |
| H01L 29/40 | (2006.01) |
| H01L 29/66 | (2006.01) |
| H01L 21/266 | (2006.01) |

(52) U.S. Cl.
CPC .......... *H01L 29/7397* (2013.01); *H01L 21/266* (2013.01); *H01L 29/0619* (2013.01); *H01L 29/0696* (2013.01); *H01L 29/407* (2013.01); *H01L 29/66348* (2013.01)

(58) Field of Classification Search
CPC .......................... H01L 21/266; H01L 29/0619
See application file for complete search history.

(56) References Cited

U.S. PATENT DOCUMENTS

| 7,112,868 | B2 | 9/2006 | Willmeroth et al. |
|---|---|---|---|
| 8,344,415 | B2 | 1/2013 | Ruething et al. |
| 8,435,863 | B2 | 5/2013 | Rahimo et al. |
| 2008/0135871 | A1 | 6/2008 | Ruething et al. |
| 2010/0270587 | A1 | 10/2010 | Rahimo et al. |
| 2010/0276727 | A1 | 11/2010 | Storasta et al. |
| 2010/0295093 | A1 | 11/2010 | Rahimo et al. |
| 2013/0341673 | A1* | 12/2013 | Pfirsch et al. .................. 257/139 |
| 2014/0291724 | A1* | 10/2014 | Voss et al. ...................... 257/140 |
| 2015/0115316 | A1* | 4/2015 | Oyama et al. .................. 257/140 |

FOREIGN PATENT DOCUMENTS

| EP | 2061084 A1 | 5/2009 |
|---|---|---|
| EP | 2249392 A2 | 11/2010 |
| WO | 2009006287 A1 | 5/2009 |
| WO | 2009062876 A1 | 5/2009 |
| WO | 2010052245 A2 | 5/2010 |

OTHER PUBLICATIONS

Rahimo, et al. "The Bi-mode Insulated Gate Transistor (BIGT) a Potential Technology for Higher Power Applications." 21st Internationl Symposium on Power semiconductor Devices and IC's. IEEE, Jun. 2009. pp. 283-286.

* cited by examiner

*Primary Examiner* — Mamadou Diallo
(74) *Attorney, Agent, or Firm* — Murphy, Bilak & Homiller, PLLC

(57) ABSTRACT

A semiconductor device includes a drift zone of a first conductivity type in a semiconductor body. Controllable cells are configured to form a conductive channel connected with the drift zone in a first state. First zones of the first conductivity type as well as second zones and a third zone of a complementary second conductivity type are between the drift zone and a rear side electrode, respectively. The first, second and third zones directly adjoin the rear side electrode. The third zone is larger and has a lower mean emitter efficiency than the second zones.

20 Claims, 11 Drawing Sheets

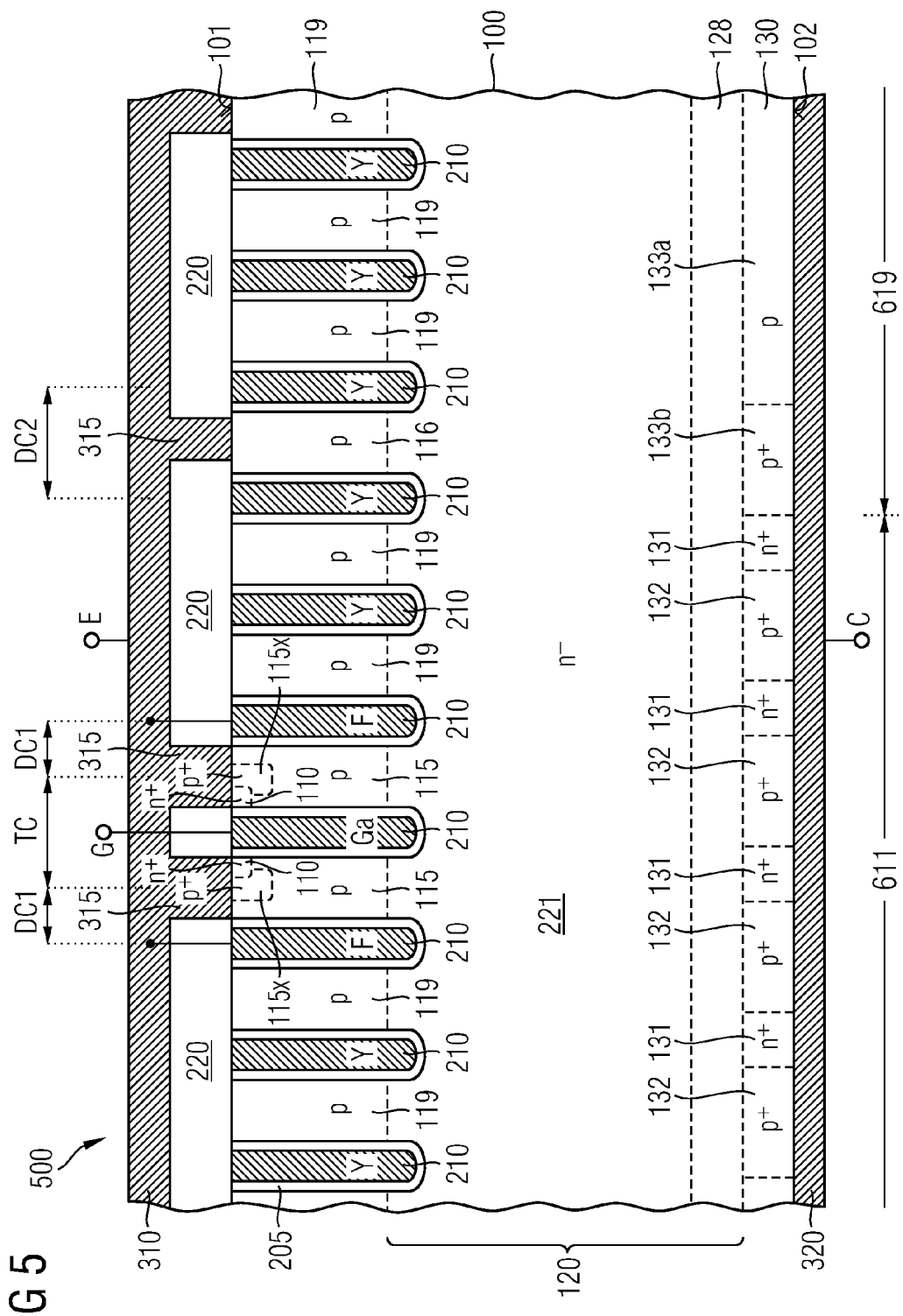

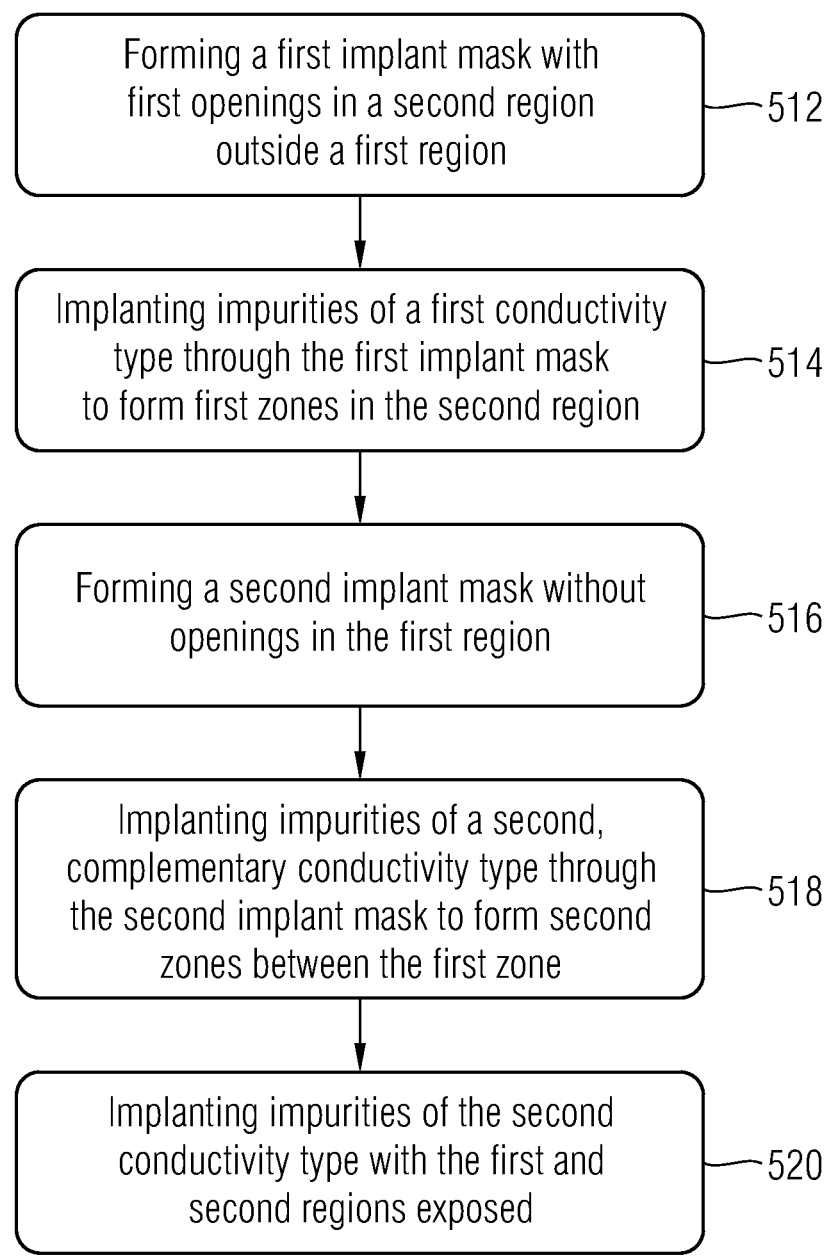

SEMICONDUCTOR DEVICE AND RC-IGBT WITH ZONES DIRECTLY ADJOINING A REAR SIDE ELECTRODE

BACKGROUND

RC-IGBTs (reverse-conducting insulated gate bipolar transistor) monolithically integrate an IGBT and a free-wheeling diode. When the RC-IGBT is forward biased, the RC-IGBT is effective as an electronic switch capable of switching on and off a current flowing in a first direction between a collector and an emitter terminal, wherein the current is subject to a gate potential applied to a gate terminal and capacitively controlling a transistor channel. The RC-IGBT is in a transistor mode as long as a unipolar electron current through the transistor channel is below a threshold beyond which a voltage drop across the pn junction along p-type anode zones is sufficiently high such that the anode zones start injecting holes into the drift layer and a bipolar current flows in an IGBT mode. When the RC-IGBT is reverse biased, the RC-IGBT operates in a diode or reverse conducting mode and conducts a current flowing opposite to the first direction irrespective of the gate potential.

Typically, improving the characteristics of one mode of multi-mode semiconductor devices such as RC-IGBTs adversely affects another mode. It is desirable to improve the device characteristics of multi-mode semiconductor devices with less adverse impact on other device characteristics.

SUMMARY

According to an embodiment a semiconductor device includes a drift zone of a first conductivity type in a semiconductor body. Controllable cells are configured to form a conductive channel connected with the drift zone in a first state. First zones of the first conductivity type as well as second zones and a third zone of a complementary second conductivity type are formed between the drift zone and a rear side electrode, respectively. The first, second and third zones directly adjoin the rear side electrode. The third zone is larger and has a lower mean emitter efficiency than the second zones.

According to another embodiment a reverse conducting insulated gate bipolar transistor includes a drift zone of a first conductivity type in a semiconductor body. Controllable cells are configured to form a conductive channel connected with the drift zone in a first state. First zones of the first conductivity type as well as second zones and a third zone of a complementary second conductivity type are between the drift zone and a rear side electrode, respectively. The first, second and third zones directly adjoin the rear side electrode. The third zone is larger and comprises at least one first zone section with a net impurity dose of at most 75% of the second zones.

According to a further embodiment a method of manufacturing a semiconductor device includes forming a first implant mask on a rear side surface of a semiconductor substrate, wherein the first implant mask is devoid of openings in a first region and comprises openings outside the first region. Impurities of a first conductivity type are implanted through the first implant mask into a pedestal layer of the semiconductor substrate, wherein the pedestal layer directly adjoins the rear side surface and wherein first zones of the first conductivity type are formed in the pedestal layer. A second implant mask is formed on the rear side surface, wherein in the first region an area fraction of openings in the second implant mask is lower than outside the first region. Impurities of a complementary second conductivity type are implanted through the second implant mask into the pedestal layer to form, outside the first region, second zones of the second conductivity type separating the first zones and, inside the first region, a contiguous third zone of the second conductivity type with a lower mean implant dose than the second zones.

According to another embodiment, a method of manufacturing a semiconductor device includes forming a first implant mask on a rear side surface of a semiconductor substrate, wherein the first implant mask is devoid of openings in a first region and includes openings in a second region outside the first region. Impurities of a first conductivity type are implanted through the first implant mask into a pedestal layer of the semiconductor substrate directly adjoining the rear side surface to form first zones of the first conductivity type in the pedestal layer. A second implant mask devoid of openings in the first region is formed on the rear side surface. Impurities of a complementary second conductivity type are implanted through the second implant mask into the pedestal layer to form, inside the second region, second zones of the second conductivity type separating the first zones. Impurities of the second conductivity type are implanted with the rear side surface exposed in both the first region and the second region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 5 is a schematic cross-sectional view of a portion of a trench-gate RC-IGBT according to another embodiment.

FIG. 8B is a simplified flow chart illustrating a method of manufacturing a semiconductor device according to an embodiment with an unmasked implant following masked implants at a rear side.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
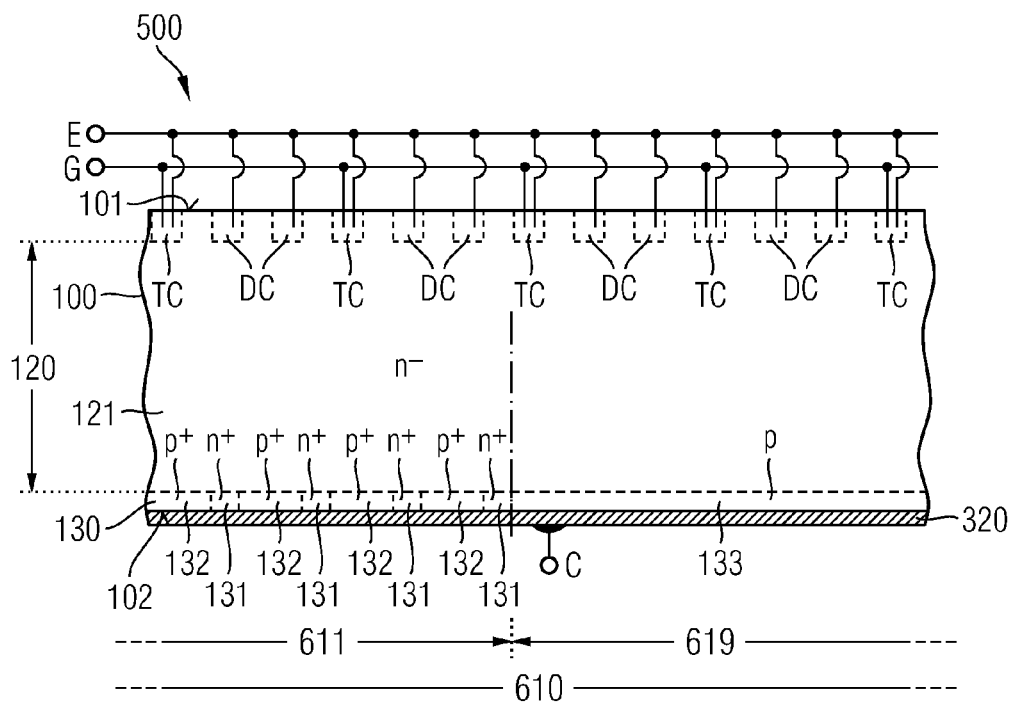
FIG. 1A is a schematic cross-sectional view of a portion of a reverse-conducting semiconductor device in accordance with an embodiment providing a third zone with a mean net impurity dose lower than in second zones of an emitter layer.

FIG. 1A refers to a reverse-conducting semiconductor device 500 such as an RC-IGBT or another semiconductor device including an RC-IGBT.

A single-crystalline semiconductor material, for example silicon (Si), silicon carbide (SiC), germanium (Ge), a silicon germanium crystal (SiGe), gallium nitride (GaN), gallium arsenide (GaAs) or another $A_{III}B_V$ semiconductor forms a semiconductor body 100 with a front side surface 101, which may be approximately planar or which may be defined by a plane spanned by coplanar surface sections, as well as a mainly planar rear side surface 102 parallel to the front side surface 101.

A minimum distance between the first and rear side surfaces 101, 102 depends on a voltage blocking capability the semiconductor device 500 is specified for. For example, the distance between the front and rear side surfaces 101, 102 may be in a range of 90 µm to 200 µm for a semiconductor device specified for a blocking voltage of about 1200 V. Other embodiments related to semiconductor devices with higher blocking capabilities may provide semiconductor bodies 100 with a thickness of several 100 µm. Semiconductor devices with low blocking capabilities may have a thickness from 35 µm to 90 µm.

In a plane parallel to the front side surface 101 the semiconductor body 100 may have a rectangular shape with an edge length in the range of several millimeters. A normal to the front side surface 101 defines a vertical direction and directions orthogonal to the vertical direction are horizontal or lateral directions.

The semiconductor body 100 includes a base region 120 with a drift zone 121 of a first conductivity type. At the front side of the semiconductor body 100 controllable cells form a conductive channel connected with the drift zone 121 in a first state of the semiconductor device 500. The controllable cells may be transistor cells TC of an RC-IGBT and allow charge carriers of a first type to pass into the drift zone 121 in a first state of the semiconductor device 500, which may correspond to a forward conducting mode including a transistor mode and an IGBT mode. The charge carriers of the first type are electrons in case of an n-type drift zone 121 or holes in case of a p-type drift zone 121.

In addition to the transistor cells TC, the semiconductor body 100 may include diode cells DC, which may also be formed at the front side. The diode cells DC inject charge carriers of a second type into the drift zone 121 in a second state of the semiconductor device 500, which may correspond to a reverse conducting mode. The charge carriers of the second type may be holes in case of an n-type drift zone 121 and electrons in case of a p-type drift zone 121.

An emitter layer 130 is sandwiched between the base region 120 and a rear side electrode 320 directly adjoining the rear side surface 102. The emitter layer 130 directly adjoins the rear side electrode 320 and may directly adjoin the drift zone 121. According to other embodiments, further doped layers or zones such as a field stop layer may be formed between the drift zone 121 and the emitter layer 130.

The transistor cells TC may be IGFET (insulated gate field effect transistor) cells with a source zone of the first conductivity type and a body zone of the second conductivity type separating the source zone of the respective transistor cell TC from the drift zone 121. The source zones may be electrically connected or coupled to an emitter terminal E of the semiconductor device 500.

Gate electrodes of the transistor cells TC may be electrically connected or coupled to a gate terminal G and are capacitively coupled to the body zones through gate dielectrics. Subject to a voltage applied to the gate terminal G, an inversion channel formed in the body zone of the respective transistor cell TC may allow an electron current through the transistor cell TC such that majority charge carriers enter the drift zone 121 through the transistor cell TC in the first state of the semiconductor device 500, which may correspond to a forward conducting mode including a transistor mode and an IGBT mode of an RC-IGBT or to a desaturation mode of other semiconductor devices. The term majority charge carrier refers to the drift zone 121. The majority charge carriers are electrons in case of an n-type drift zone.

The diode cells DC may include diode zones of the second conductivity type and may be electrically connected or coupled to the emitter terminal E. The diode cells DC inject minority charge carriers into the drift zone 121 in a second state of the semiconductor device 500, wherein the second state may correspond to a reverse conducting mode of an RC-IGBT or a non-desaturation mode of other semiconductor devices, by way of example. The minority charge carriers are holes in case of an n-type drift zone. The transistor and diode cells TC, DC may be planar-gate cells with planar gate electrodes arranged outside a contour of the semiconductor body 100 or trench-gate cells with trench electrodes extending into the semiconductor body 100. For example, transistor cells TC and diode cells DC may be formed in different semiconductor mesas separated by trench-gate structures or may alternate along the same semiconductor mesa.

Apart from the drift zone 121, the base region 120 may include various further doped layers and zones, for example barrier layers increasing the plasma density at a side of the base region 120 oriented to the transistor and diode cells TC, DC, field stop layers for preventing an electric field from reaching the emitter layer 130 in a blocking state, a super junction structure for increasing the voltage blocking capabilities at a comparatively high impurity concentration in the drift zone 121 as well as counter-doped islands of the second conductivity type.

An impurity concentration in the drift zone 121 may gradually or in steps increase or decrease with increasing distance to the front side surface 101 at least in portions of its vertical extension. According to other embodiments, the impurity concentration in the drift zone 121 may be approximately uniform. For RC-IGBTs based on silicon, a mean impurity concentration in the drift zone 121 may be between $5E12$ $cm^{-3}$ and $1E15$ $cm^{-3}$, for example in a range from $1E13$ $cm^{-3}$ to $1E14$ $cm^{-3}$. In the case the semiconductor device 500 is based on SiC, a minimum impurity concentration in the drift zone 121 may be between $5E14$ $cm^{-3}$ and $1E17$ $cm^{-3}$, for example in a range from $1E15$ $cm^{-3}$ to $1E16$ $cm^{-3}$.

The emitter layer 130 includes at least one third zone 133 of the second conductivity type in a first region (pilot region) 619 and first zones 131 of the first conductivity as well as second zones 132 of the second conductivity type in a second region 611 (RC region, reverse-conducting region) of an active area 610 that includes the transistor and diode cells TC, DC. The first, second and third zones 131, 132, 133 extend from the base region 120 to the rear side electrode 320, respectively.

According to the illustrated embodiment the first, second and third zones 131, 132, 133 directly adjoin the drift zone 121. According to other embodiments, at least some or each of the first, second and third zones 131, 132, 133 may directly adjoin a field stop layer sandwiched between the drift zone 121 and the emitter layer 130.

According to an embodiment, a mean net impurity concentration in the first, second and third zones 131, 132, 133 may be sufficiently high to ensure an ohmic contact with the material of a rear side electrode 320 directly adjoining the rear side surface 102 and depends on the semiconductor material, the material of the rear side electrode 320 as well as the conductivity type of the respective zone. For example, in case the semiconductor body 100 is based on silicon, a mean impurity concentration of the first, second and third zones 131, 132, 133 may be at least $5E16$ $cm^{-3}$ for p-type zones, for example at least $1E18$ $cm^{-3}$, and $1E18$ $cm^{-3}$ for n-type zones, for example at least $6E19$ $cm^{-3}$.

The rear side electrode 320 may form or may be electrically connected to a collector terminal C of the semiconductor device 500.

The first and second zones 131, 132 alternate in the RC-region 611 of the active area 610. A lateral extension of the third zone 133 defines the first region 619.

In a forward conducting state of the semiconductor device 500 in the transistor and/or IGBT modes, the third zone 133 has a lower mean emitter efficiency than the second zones 132. The lower mean emitter efficiency may be realized by a locally increased net impurity concentration in the drift zone 121 within the first region 619 with respect to corresponding portions of the drift zone 121 in the vertical projection of the second zones 132 or by a lower effective mean net impurity dose in the third zones 133 with respect to the second zones 132 or by both. According to the illustrated embodiment the mean net impurity dose in the third zone 133 is at most 75% of the mean net impurity dose in the second zones 132.

The third zone 133 has a larger lateral extension in a plane parallel to the second surface 102 than any of the second zones 132. According to an embodiment a minimum width of the third zone 133 is at least twice, e.g. at least five times, as large as the minimum distance between neighboring first zones 131 separated by one of the second zones 132 in the second region 611.

For the following description, it is assumed that the semiconductor device 500 is an n-channel RC-IGBT with the first conductivity type being the n-type and the second conductivity type being the p-type. Equivalent considerations apply for RC-IGBTs with the first conductivity type being the p-type and the second conductivity type the n-type.

In a forward mode of the semiconductor device 500 a positive voltage is applied between the collector and the emitter terminals C, E. The semiconductor device 500 is in a forward blocking mode as long as a gate voltage applied to the gate terminal G is below a threshold voltage at which inversion channels are formed in the transistor cells TC. When the gate voltage exceeds the threshold voltage, the respective transistor cell TC forms an inversion channel and electrons enter into the drift zone 121 through the transistor cell TC in a forward conducting mode of the semiconductor device 500.

In the forward conducting mode the RC-IGBT 500 is in a transistor mode as long as the on-state current is a unipolar current based on electrons entering through the transistor channels and discharged at the n-type first zones 131. Close to the second zones 132 and the third zones 133, the local electron flow has a lateral component which, with increasing electron current, increasingly forward biases the pn junctions between the drift zone 121 on one side and the p-type second zones 132 and third zones 133 on the other side. A resulting voltage drop at the respective pn junction is the higher the longer a distance to the first zones 131 is. At a sufficiently high electron current a voltage drop in the center of the p-type third zone 133 is sufficiently high to start injection of holes into the drift zone 121. The holes contribute to the current through the drift zone 121. With increasing current the voltage drop further increases and hole injection spreads over greater portions of the third zone 133 and finally starts also in the second zones 132 allowing a bipolar current through the drift zone 121. The semiconductor device 500 changes into the IGBT mode with lower on-state resistance than in the transistor mode.

In the RC mode, a negative voltage is applied between the collector and emitter terminals C, E. The first zones 131 inject electrons and diode zones of the diode cells DC and/or body zones of the transistor cells TC may inject holes into the drift zone 121 to generate a bipolar current at low forward resistance.

Due to the lower on-state resistance in the IGBT mode, RC-IGBTs are typically designed such that they switch from the transistor mode to the IGBT mode at on-state currents as low as possible. The larger a p-type zone in the emitter layer 130 is, the longer is a lateral distance the electrons have to flow in front of the p-type zone and the smaller is an on-state current that suffices to trigger hole injection. Wide p-type zones in the emitter layer 130 such as the third zone 133 support a fast transition to the IGBT mode at low currents. On the other hand, large distances between n-type zones in the emitter layer 130 may prevent a reverse current to make effective use of the whole volume of the drift zone 121 in the RC mode.

In the semiconductor device 500 the wide third zone 133 is effective as an ignition island and ensures that the semiconductor device 500 changes from the transistor mode to the IGBT mode at low on-state currents, since yet a low current suffices to trigger injection of holes in the center of the third zone 133. On the other hand, comparatively densely arranged n-type first zones 131 in the second region 611 outside the first region 619 are sufficiently close to each other such that a sufficiently dense charge carrier plasma is generated in the second region 611 in the RC mode. More particularly, with the comparatively densely arranged n-type first zones 131, the reverse current in the RC mode is prevented from flowing along a lateral direction to such a degree that a high voltage drop across the drift zone 121 occurs at the same time when a large volume is flooded with the charge carrier plasma thereby resulting in a worse trade-off between the forward voltage drop of the reverse diode and the recovery charge of the reverse diode.

The reduced hole emitter efficiency of the third zone 133 with respect to the hole emitter efficiency of the second zones 132 at least partly compensates for a stronger hole injection in the first region 619 in the IGBT mode due to the absence of the n-type zones 131 in the first region 619. The reduced emitter efficiency results in a more homogeneous charge carrier plasma and current density distribution in the base region 120 among the first region 619 and the second region 611. With a more homogeneous charge carrier plasma and current density distribution the temperature distribution is more uniform and a higher overall on-state current can be allowed to flow before a temperature in the semiconductor body 100 locally exceeds a tolerable maximum temperature.

With respect to a reference semiconductor device with the same impurity concentration in the second zones 132 and the third zone 133, a higher nominal current can be specified for the semiconductor device 500 at comparatively low adverse impact on other device parameters, wherein the nominal current is the maximum continuous current the semiconductor device 500 can sustain without being irreversibly damaged.

In the embodiment of FIG. 1A, the lower mean net implant dose in the third zone 133 with respect to the second zones 132 reduces the hole emitter efficiency in the IGBT mode. Other embodiments may provide a zone with locally increased mean net n-type impurity dose or concentration in the first region 619 of the drift zone 121.

According to an embodiment, the mean net impurity dose in the complete third zone 133 is at most 0.8 times as high as in the second zones 132, for example at most 0.7 times as high. The mean net impurity dose in the second zones is at least 1.25 times and at most six times as high as in the third zones 133. According to an embodiment the mean net impurity dose in the second zones 132 may be at least twice as high and at most three times as high as in the third zones 133.

Figure 1B:
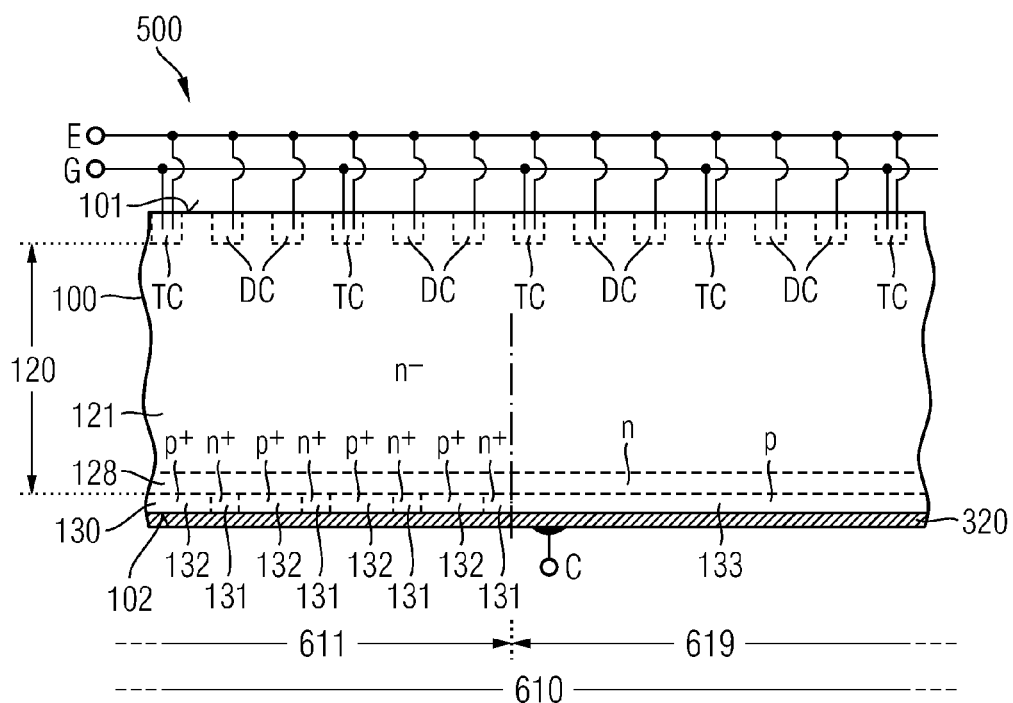
FIG. 1B is a schematic cross-sectional view of a portion of a semiconductor substrate according to an embodiment providing a low doped third zone and a field stop layer.

The semiconductor device 500 of FIG. 1B is an RC-IGBT which differs from the RC-IGBT of FIG. 1A in that the emitter layer 130 does not directly adjoin the drift zone 121. Instead, a field stop layer 128 of the first conductivity type separates the drift zone 121 from the emitter layer 130. A mean net impurity concentration in the field stop layer 128 is at least five times as high as the mean net impurity concentration in the drift zone 121. According to an embodiment, the mean net impurity concentration in the field stop layer 128 is in a range from $2E14\,cm^{-3}$ to $1E17\,cm^{-3}$. According to further embodiments, the second region 611 may include counter doped islands in the vertical projection of the first zones 131.

Figure 2A:
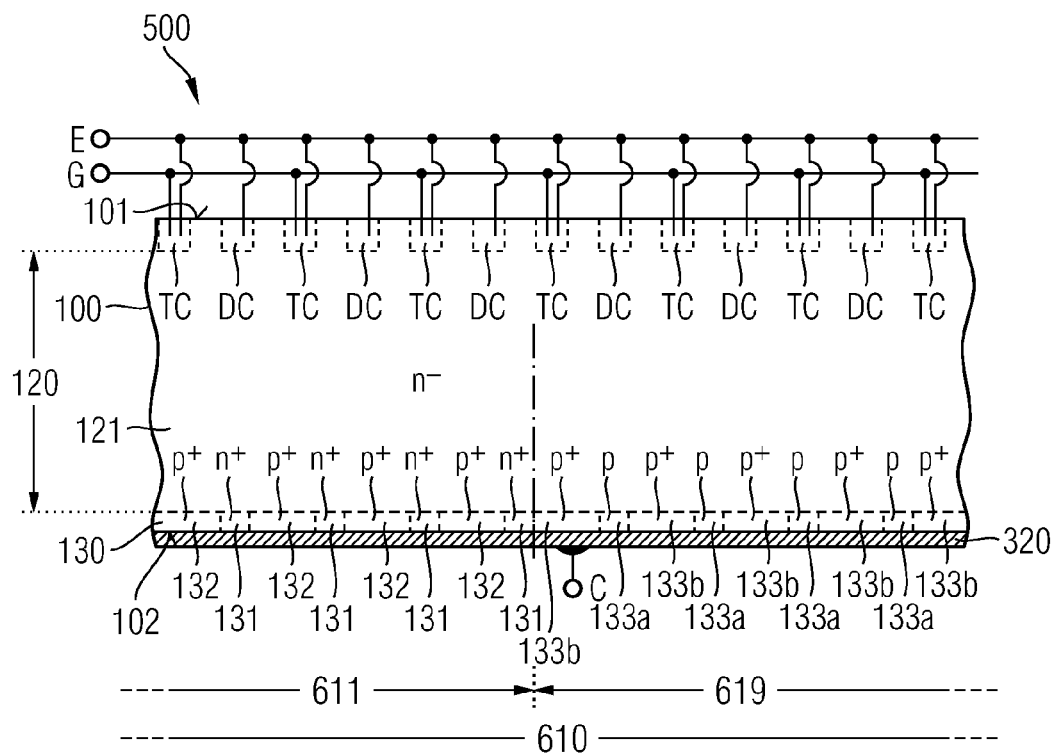
FIG. 2A is a schematic cross-sectional view of a portion of a reverse-conducting semiconductor device according to an embodiment providing a third zone with differently doped sections.
Figure 2B:
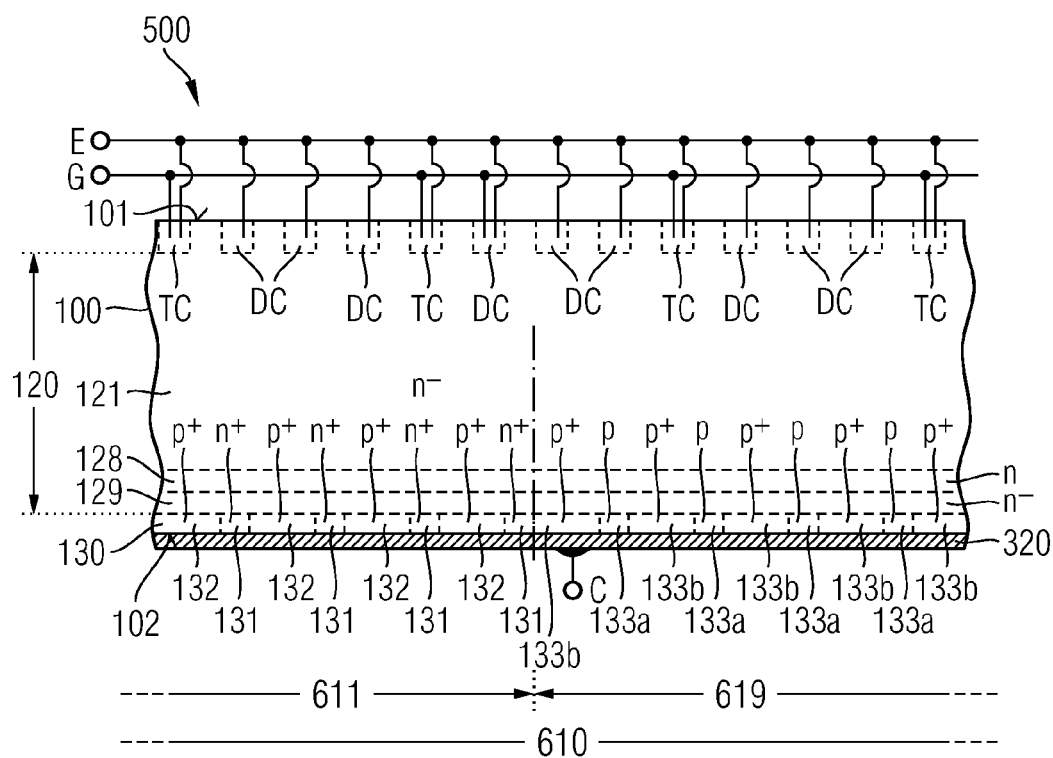
FIG. 2B is a schematic cross-sectional view of a portion of a reverse-conducting semiconductor device in accordance with an embodiment providing a field stop layer spaced from an emitter layer.
Figure 3A:
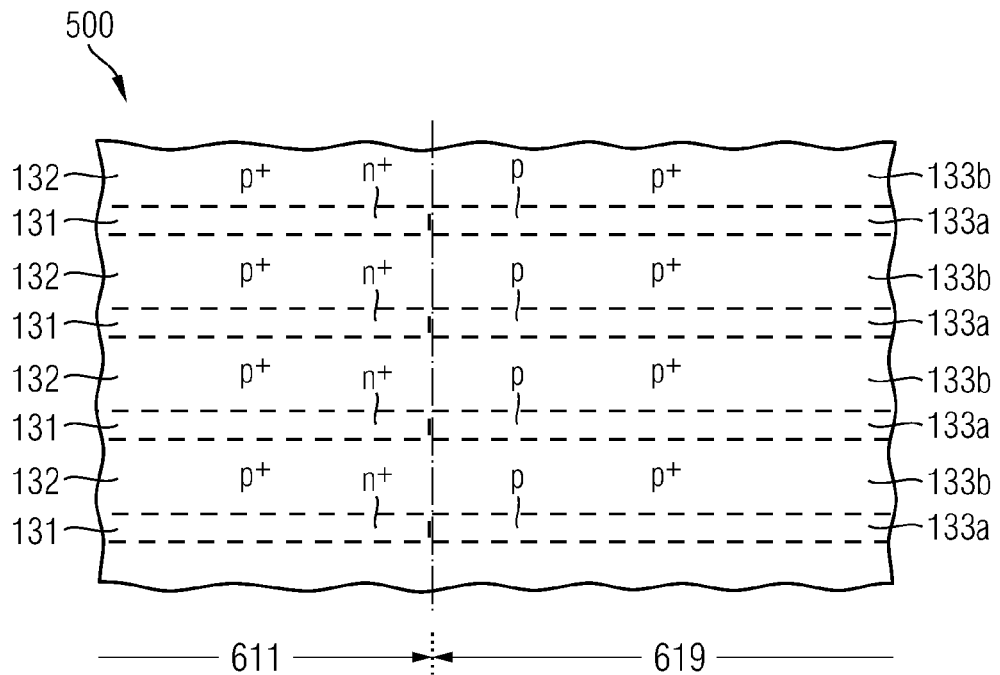
FIG. 3A is a schematic horizontal cross-sectional view of a portion of a reverse-conducting semiconductor device in accordance with an embodiment providing low doped zone sections in the longitudinal projection of stripe shaped first zones.
Figure 3B:
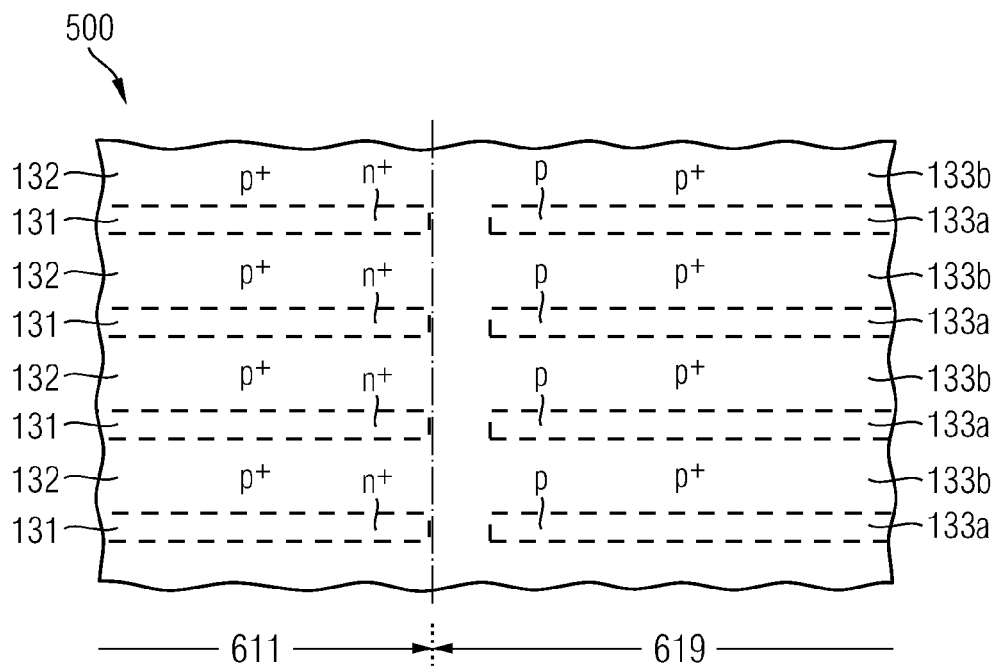
FIG. 3B is a horizontal cross-sectional view of a portion of a reverse-conducting semiconductor device in accordance with an embodiment providing low doped zone sections spaced from the first zones.
Figure 3C:
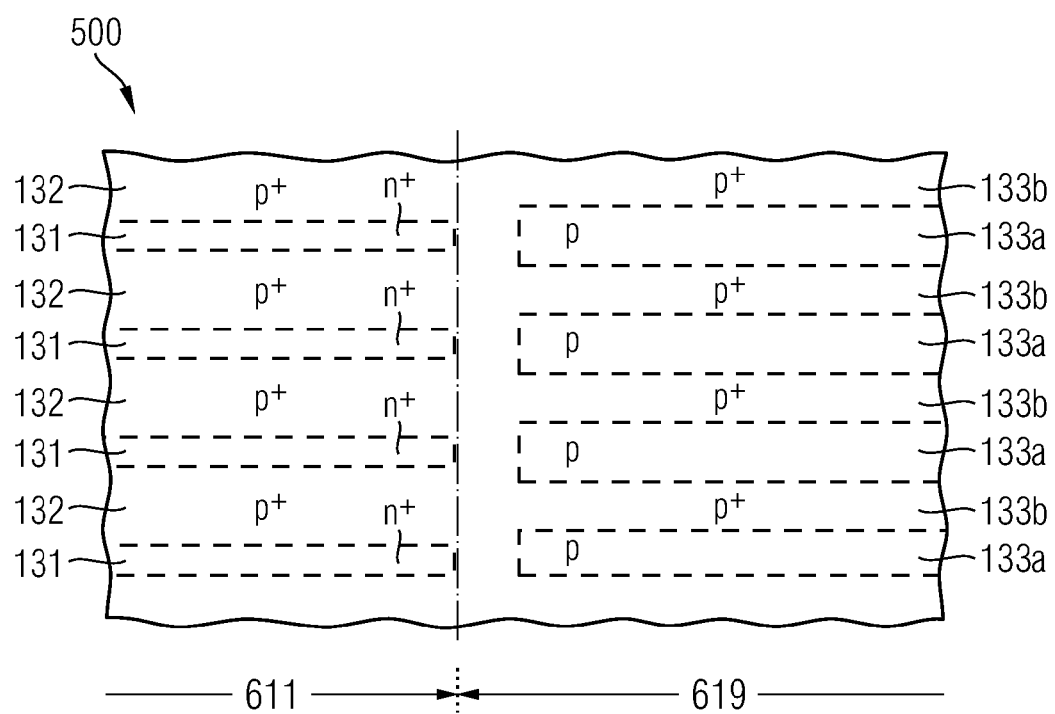
FIG. 3C is a schematic horizontal cross-sectional view of a portion of a reverse-conducting semiconductor device in accordance with an embodiment providing lower doped zone sections wider than more heavily doped zone sections.

FIGS. 2A and 2B as well as FIGS. 3A to 3C refer to various embodiments concerning modifications of the third zone 133.

According to the embodiments of FIGS. 2A and 2B, the third zone 133 includes at least one first zone section 133a having a net impurity dose which is at most 80% of the net impurity dose in the second zones 132. According to another embodiment, the net impurity dose of the first zone sections 133a is at most 50% of the net impurity dose of the second zones 132.

The third zone 133 further includes second third zone sections 133b with a higher net impurity dose than the first third zone sections 133a and closer to the net impurity dose in the second zones 132. According to an embodiment, the net impurity dose of the second zone sections 133b may be the same or approximately the same as in the second zones 132.

One of the second zone sections 133b may directly adjoin that first zone 131 that directly adjoins the third zone 133. According to an embodiment, a second zone section 133b directly adjoining one of the first zones 131 has a width of at most five times a sum of a mean width of the first zones 131 and a mean width of the second zones 132.

According to an embodiment, the first zone sections 133a have a first lateral dimension in the same order of magnitude as a second lateral dimension orthogonal to the first lateral direction, for example polygons such as rectangles or squares with or without rounded corners, circles, ellipses, ovals or rings embedded in one contiguous second zone section 133b. For example, the second zone sections 133b may form a regular grid with the first zone sections 133a arranged in the meshes of the grid or vice versa. According to another embodiment, the first zones 131 in the second region 611 and the first zone sections 133a are arranged in different portions of the same regular pattern such as a matrix.

In FIG. 2A, a pitch (center-to-center distance) of the first zone sections 133a is equal to a pitch of the first zones 131 along the same lateral direction, wherein a width of the first third zones sections 133a may be smaller, equal or greater than the width of the first zones 131 with respect to the same lateral direction.

The semiconductor device 500 of FIG. 2B is a further RC-IGBT including a field stop layer 128 spaced from the emitter layer 130. A spacer layer 129 separating the emitter layer 130 from the field stop layer 128 has the first conductivity type and may have an impurity concentration similar or equal to the mean net impurity concentration of the drift zone 121. The spacer layer 129 may reduce or prevent a partial compensation of portions of the emitter layer 130 and the field stop layer 128. FIGS. 3A to 3C are horizontal cross-sectional views of semiconductor devices 500 whose third zones 133 include first zone sections 133a formed in the longitudinal projection of stripe-shaped first zones 131 in the second region 611 as well as second zone sections 133b having a higher impurity concentration than the first zone sections 133a.

In FIG. 3A the second zone sections 133b directly adjoin the second zones 132 and extend in the longitudinal projection of the second zones 132. The second zones 132 and the second zone sections 133b may have the same impurity concentration or net impurity dose and may represent two directly adjoining sections of a contiguous structure. The first zone sections 133a extend in the longitudinal projection of stripe-shaped first zones 131. The first zone sections 133a and the first zones 131 may have the same width. Accordingly, the second zones 132 and the second zone sections 133b may have the same width. A same implant mask in combination with a mask distinguishing between first regions 619 and second regions 611 may be used for defining the first zones 131 as well as the first zone sections 133a. A lateral pattern of the hole current flow and the hole distribution is similar in the RC and first regions 611, 619 apart from that the local hole current density has more pronounced minima above the first zones 131 as above the first zone sections 133a.

In FIG. 3B the first zone sections 133a are arranged in the longitudinal projection of the first zones 131, wherein portions of the second zone sections 133b separate the first zones 131 from the first zone sections 133a. The distance between the first zones 131 and the first zone sections 133a may be greater than the width of the first zones 131. According to an embodiment, the distance between the first zones 131 and the first zone sections 133a is at most five times the pitch of the first zones 131 in the second region 611.

The semiconductor device 500 of FIG. 3C includes first zone sections 133a arranged in the longitudinal projection of stripe-shaped first zones 131 into the first region 619. In a second lateral direction orthogonal to the longitudinal extension a pitch of the first zone sections 133a is equal to the pitch of the first zones 131 in the second region 611. The width of the first zone sections 133a is greater than the width of the first zones 131. The reduced width of the second zone section 133b with respect to the second zones 132 and the resulting reduced hole injection may at least partly compensate for the additional hole injection in the first zone sections 133a with respect to the first zones 131, where no hole injection takes place. As a result, a pattern of the hole distribution in a portion of the drift zone 121 assigned to the first region 619 may follow more precisely the pattern of the hole density distribution in a portion of the drift zone 121 assigned to the second region 611 in the IGBT mode.

Figure 4A:
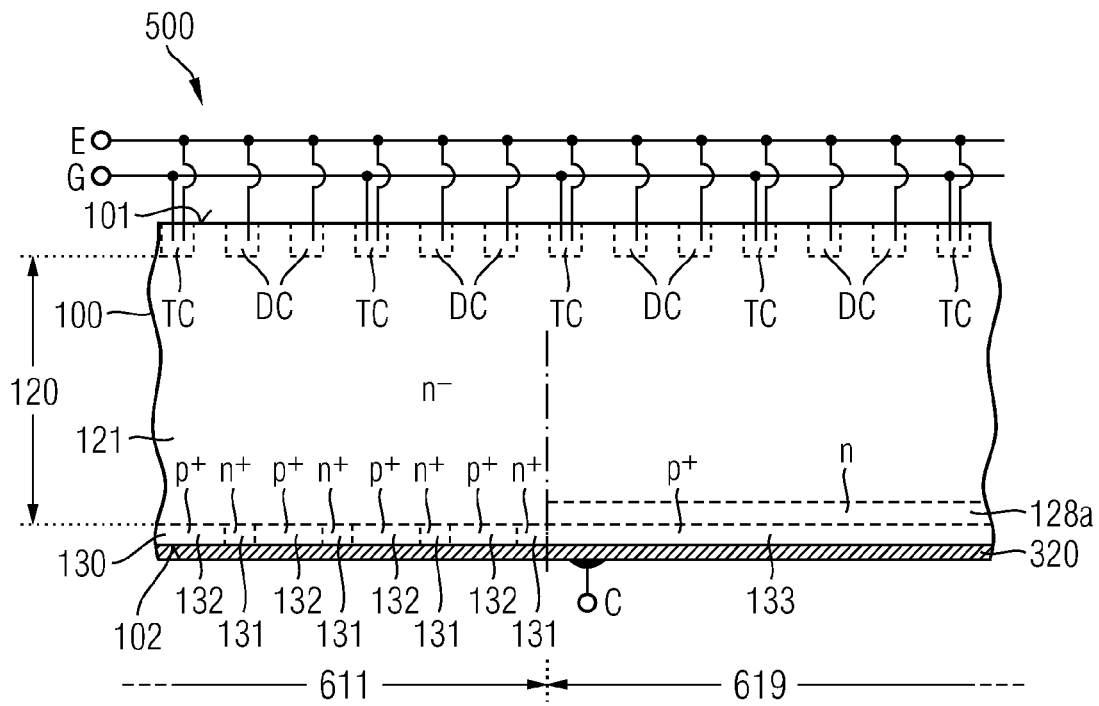
FIG. 4A is a schematic cross-sectional view of a portion of a reverse-conducting semiconductor device in accordance with an embodiment providing a field stop zone directly adjoining the third zone.
Figure 4B:
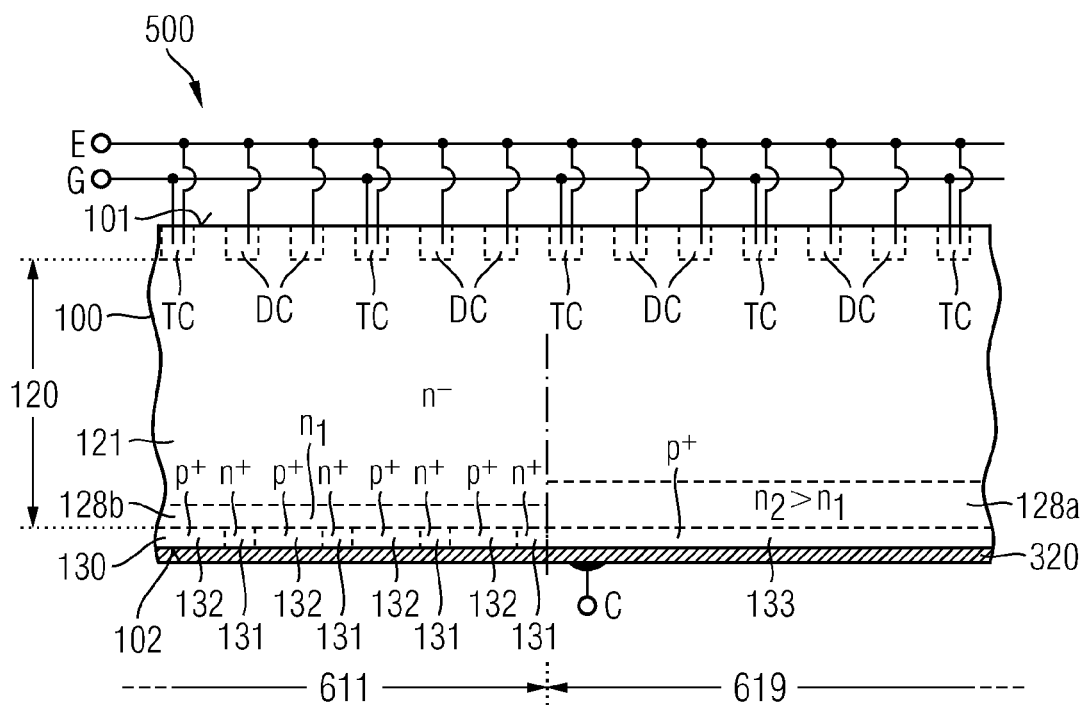
FIG. 4B is a schematic cross-sectional view of a portion of a reverse-conducting semiconductor device in accordance with an embodiment providing a field stop layer with enhanced impurity dose in a first region.

FIGS. 4A to 4B refer to semiconductor devices 500 with the hole emitter efficiency of a third zone 133 in a first region 619 reduced by a modification of the impurity concentration in portions of the base region 120 close to the emitter layer 130.

In FIG. 4A the semiconductor device 500 includes a third zone 133 having the same impurity dose as the second zones 132 in the second region 611 or a net impurity dose that falls below the net impurity dose of the second zones 132 by less than 20%. A field stop zone 128a having a net impurity concentration at least twice, e.g., at least five times as high as the drift zone 121 is formed at least in a portion of the first region 619 and is absent at least in the vertical projection of the second zones 132 in the second region 611. According to the illustrated embodiment, the field stop zone 128a is absent in the complete second region 611. In the IGBT mode, the field stop zone 128a selectively reduces hole emitter efficiency of the third zone 133 with respect to the hole emitter efficiency of the second zones 132 such that a hole distribution in the drift zone 121 is more homogeneous.

The semiconductor device 500 of FIG. 4B includes a first field stop zone 128a mainly or completely formed in the first region 619 and a second field stop zone 128b mainly or completely formed in the second region 611.

The first field stop zone 128a may be formed exclusively in a portion of the first region 619 distant to the second region 611, may be completely absent in the second region 611 or may overlap at least with the outermost first zone 131 of the second region 611. The second field stop zone 128b may be formed exclusively in the second region 611, may be spaced from the first region 619 or may overlap with the first region 619. A mean net impurity dose in the first field stop zone 128a is at least twice, for example three or five times as high as in the second field stop zone 128b. The patterned field stop of FIGS. 4A and 4B may be combined with the reduced mean net impurity dose in the third zone 133 as described with reference to FIG. 1A.

The effect of the embodiments is widely independent of structural details of the transistor and diode cells TC, DC. FIG. 5 shows a first region with reduced emitter efficiency in combination with one of numerous possible embodiments for transistor and diode cells TC, DC.

The semiconductor device 500 of FIG. 5 is an RC-IGBT with trench gates. As regards details of the base region 120 and the epitaxial layer 130, reference is made to the description of the previous figures.

Buried electrode structures 210 of the transistor cells TC extend from the first surface 101 into the semiconductor body 100. Dielectric liners 205 separate the buried electrode structures 210 from the semiconductor material of the semiconductor body 100. The buried electrode structures 210 may be parallel stripes arranged in a regular pattern. According to other embodiments, the lateral cross-sectional areas of the buried electrode structures 210 may be circles, ellipsoids, ovals or rectangles, i.e. squares, with or without rounded corners, or rings. For example two or three buried electrode structures 210 may form an arrangement with two or three concentric rings, wherein the rings may be circles, ellipsoids, ovals, or rectangles, e.g., squares with rounded corners.

Each transistor cell TC may be formed between two neighboring buried electrode structures 210 or within a ring-shaped buried electrode structure 210. The semiconductor body 100 may include a plurality of approximately identical transistor cells TC arranged in regular patterns in one or more cell arrays. In each transistor cell TC a body zone 115 of the second conductivity type may extend between the two neighboring buried electrode structures 210 or within the ring-shaped buried electrode structure 210. The body zone 115 forms a pn junction with the drift zone 121. In each transistor cell TC at least one, e.g. two, source zones 110 of the first conductivity type may extend from the first surface 101 into the semiconductor body 100.

The body zones 115 may include at least one, e.g. two, contact zones 115x of the second conductivity type. The contact zones 115x are formed between the source zones 110 and remaining portions of the body zones 115 outside the contact zones 115x and directly adjoin the source zones 110. A maximum net impurity concentration in the contact zones 115x is significantly higher than a maximum net impurity concentration in the remaining portions of the body zones 115 outside the contact zones 115x. For example, the maximum net impurity concentration in the contact zones 115x exceeds at least ten times the maximum net impurity concentration in the remaining portions of the body zones 115. The contact zones 115x may result from an implant process provided in addition to the formation of the body zones 115 and reduce the risk of latch-up effects.

Each source zone 110 forms a pn junction with the body zones 115 that may or may not include contact zones 115x. The source zones 110 directly adjoin the dielectric liner 205. The contact zones 115x may extend deeper into the semiconductor body 100 than the source zones 110.

Buried electrode structures 210 directly adjoining the transistor cells TC provide insulated gate electrodes Ga. A potential applied to the insulated gate electrodes Ga controls a minority charge carrier distribution in channel portions of the body zones 115, wherein the channel portions adjoin the insulated gate electrodes Ga between the source zones 110 and the drift zone 121. If in a forward mode the gate potential applied to the insulated gate electrodes Ga exceeds a predefined threshold voltage, inversion channels of the first conductivity type are formed in the body zones 115 along the insulated gate electrodes Ga and an on state current flows between the source zones 110 and the emitter layer 130. Other buried electrode structures 201 may provide auxiliary electrodes Y and field electrodes F.

Through the transistor cells TC majority charge carriers enter the drift zone 121 in the forward conducting mode. Where body zones 115 or contact zones 115x adjoin the front side surface 101 or a contact trench, first diode cells DC1 may be formed that inject minority charge carriers in the RC mode into the drift zone 121. The body zones 115 are effective as diode zones of the first diode cells DC1 as mentioned with reference to FIG. 1A.

The semiconductor body 100 may include at least one further diode cell DC2 and/or at least one spacer region between the transistor and diode cells TC, DC1, DC2. Each spacer region may separate two neighboring diode cells DC1, DC2, or may be formed between a transistor cell TC and a diode cell DC1, DC2.

In each second diode cell DC2 an anode zone 116 of the second conductivity type is formed between two neighboring buried electrode structures 210 or within a ring-shaped buried electrode structure 210 between the first surface 101 and the drift zone 121. Each anode zone 116 forms a pn junction with the drift zone 121. The anode zones 116 are effective as diode zones of the second diode cells DC2 as mentioned with reference to FIG. 1A.

In each spacer region a floating zone 119 of the second conductivity type may extend between neighboring buried electrode structures 210 or within a ring-shaped buried electrode structure 210 from the first surface 101 into the semiconductor body 100.

Contact structures 315 extending through openings of a dielectric layer 220 electrically connect a front side electrode 310 with the source zones 110 of the transistor cells TC, the body zones 115 of first diode cells DC1 and the anode zones 116 of second diode cells DC2. The first dielectric structure 220 may dielectrically insulate the front side electrode 310 from the floating zones 119 in the semiconductor body 100 and the buried electrode structures 210. The front side electrode 310 may form or may be electrically connected or coupled to an emitter terminal E. The rear side electrode 320 may form a collector terminal C or may be electrically coupled or connected to a collector terminal C.

Each of the front and rear side electrodes 310, 320 may consist of or contain, as main constituent(s), aluminum (Al), copper (Cu) or alloys of aluminum or copper, for example AlSi, AlCu, or AlSiCu. According to other embodiments, the rear side electrode 320 may contain one, two, three or more sub-layers, each sub-layer containing, as a main constituent, at least one of nickel (Ni), titanium (Ti), vanadium (V), silver (Ag), gold (Au), tungsten (W), platinum (Pt) and palladium (Pd). For example, a sub-layer may contain a metal nitride or a metal alloy containing Ni, Ti, V, Ag, Au, W, Pt, and/or Pd.

The material of the gate electrode structures 210 may be heavily doped polycrystalline silicon. According to other embodiments, the gate electrode structures 210 are layered structures with a layer containing a metal or metal compound.

Figure 6A:
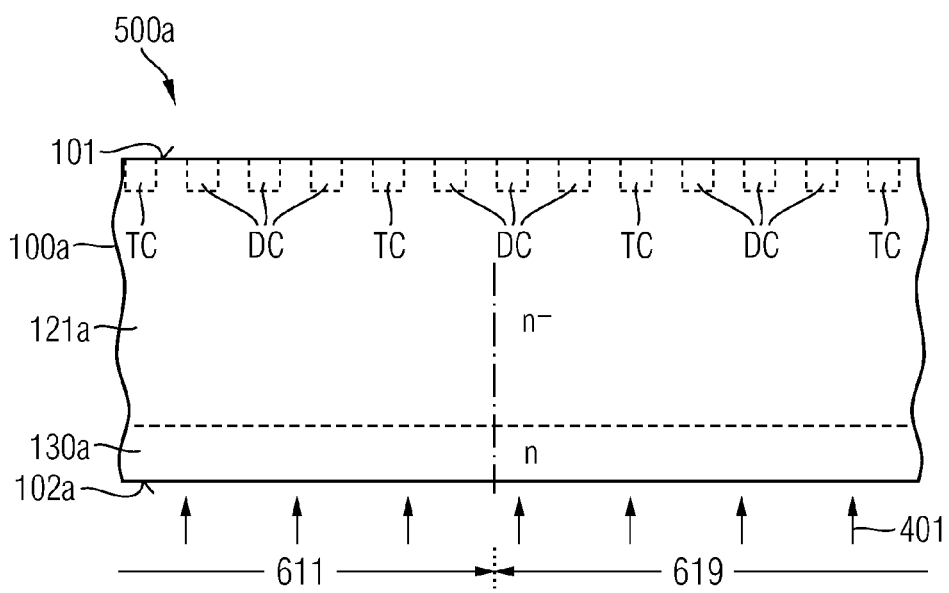
FIG. 6A is a schematic cross-sectional view of a portion of a semiconductor substrate for illustrating a step of a method of manufacturing a reverse-conducting semiconductor device according to an embodiment providing an unmasked implant.
Figure 6B:
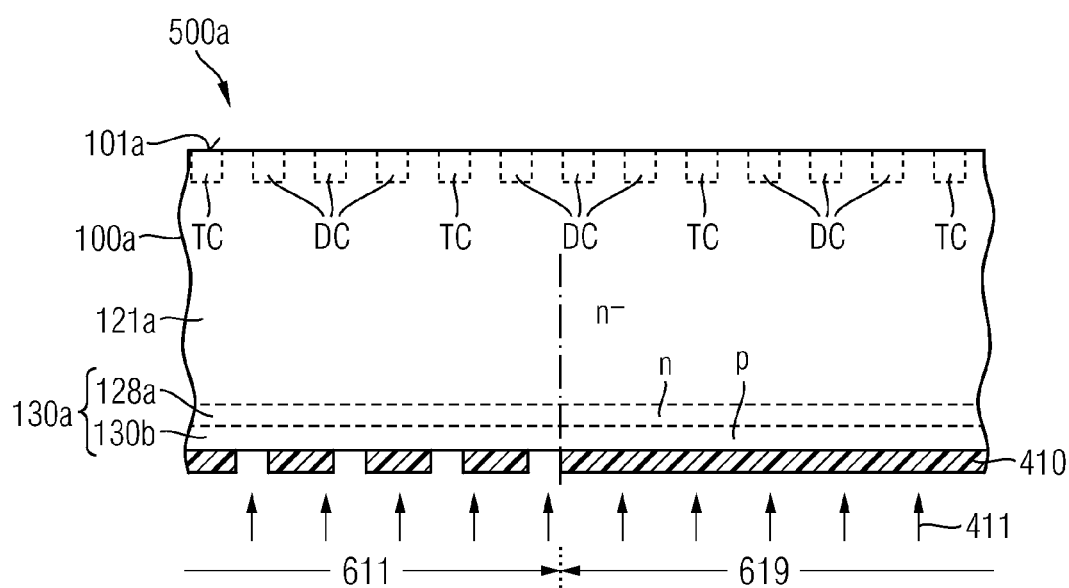
FIG. 6B shows the semiconductor substrate portion of FIG. 6A during a first masked implant using a first implant mask on a rear side surface.
Figure 6C:
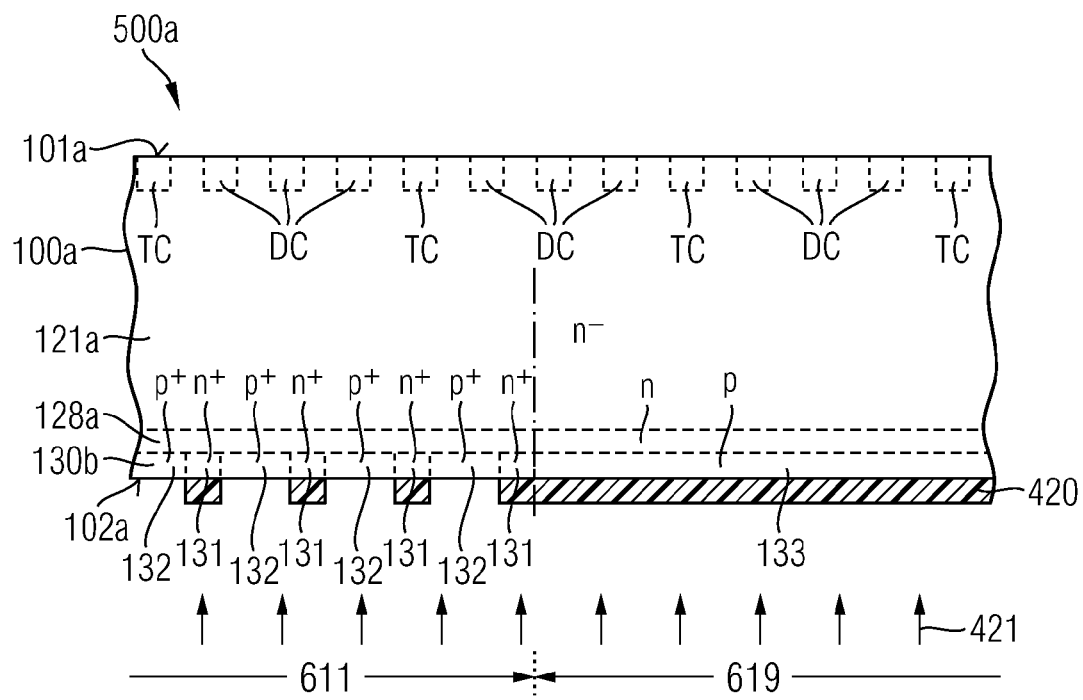
FIG. 6C shows the semiconductor substrate portion of FIG. 6B during a second masked implant using a second implant mask on the rear side surface.

FIGS. 6A to 6C refer to a method of forming an emitter layer with first zones of a first conductivity type, heavily doped second zones of the second conductivity type and less heavily doped third zones of the second conductivity type. In the figures, the first conductivity type is the n-type and the second conductivity type is the p-type. Equivalent considerations apply to first zones of the p-type and second zones of the n-type.

FIG. 6A refers to a semiconductor substrate 500a, which may be a semiconductor wafer from a single crystalline semiconductor material, for example silicon (Si), germanium (Ge), a silicon germanium (SiGe) crystal, silicon carbide (SiC), gallium nitride (GaN), gallium arsenide (GaAs) or any other $A_{III}B_V$ semiconductor.

The semiconductor substrate 500a may include a semiconductor portion 100a with a first surface 101a and a second surface 102a parallel to the first surface 101a. The semiconductor portion 100a may contain a weakly doped n-type drift layer 121a and, optionally, a more heavily doped pedestal layer 130a separating the drift layer 121a from the second surface 102a.

The pedestal layer 130a may be a base substrate obtained from a silicon ingot and the drift layer 121a may be an epitaxial layer grown by epitaxy on the pedestal layer 130a. According to another embodiment, the complete semiconductor portion 100a may be obtained from a silicon ingot. In this case the pedestal layer 130a is the lower part of the semiconductor portion 100a adjoining the second surface 102a.

Portions of transistor and diode cells TC, DC may be formed oriented along the first surface 101a.

In course of a first implant process, p-type impurities 401 are implanted through the second surface 102a into a portion of the pedestal layer 130a directly adjoining the second surface 102a.

FIG. 6B shows an implant layer 130b formed by the first impurities 401 locally overcompensating the n-type impurities of the pedestal layer 130a. A remaining portion of the pedestal layer 130a may form a field stop layer 128a separating the drift layer 121a from the implant layer 130b.

A first mask layer is deposited on the second surface 102a and patterned by lithography to form a first implant mask 410. The first implant mask 410 completely covers first regions 619 of the second surface 102a. In second regions 611, openings in the first implant mask 410 expose portions of the implant layer 130b. N-type impurities 411 are implanted into the implant layer 130b. The n-type impurities locally overcompensate the p-type impurities of the implant layer 130b in sections exposed by the openings in the first implant mask 410 to form heavily $n^+$ doped first zones 131.

A second implant mask 420 is formed that at least in part replaces the first implant mask 410 of FIG. 6B on the second surface 102a. For example, the first implant mask 410 may be removed, a second mask layer may be deposited and patterned by lithography to form the second implant mask 420.

FIG. 6C shows the second implant mask 420 which completely covers portions of the second surface 102a in the first region 619 and portions of the second surface 102a assigned to the first zones 131 in the second region 611. The openings in the second implant mask 420 expose portions of the implant layer 130b between the first zones 131. P-type impurities 421 are introduced through the openings in the second implant mask 420 to form heavily doped p-type second zones 132 in the second region 611.

The sequence of the implants in FIGS. 6A to 6C may be altered. For example, the step of implanting the p-type impurities 401 may be performed after the other steps described above and after an annealing process performed after the other implantation steps. The annealing step may reach a temperature of at least 600° C. or at least 800° C.

In case the dose of the p-type impurities 421 is sufficiently low not to overcompensate the n-type impurities 411 the second implant mask 420 also may expose the complete second region 611.

The semiconductor substrate 500a may be cut or sawn to obtain a plurality of identical semiconductor devices 500 as described with reference to FIGS. 1A to 1B, 2A to 2B, 3A to 3C and 5, by way of example.

Figure 7A:
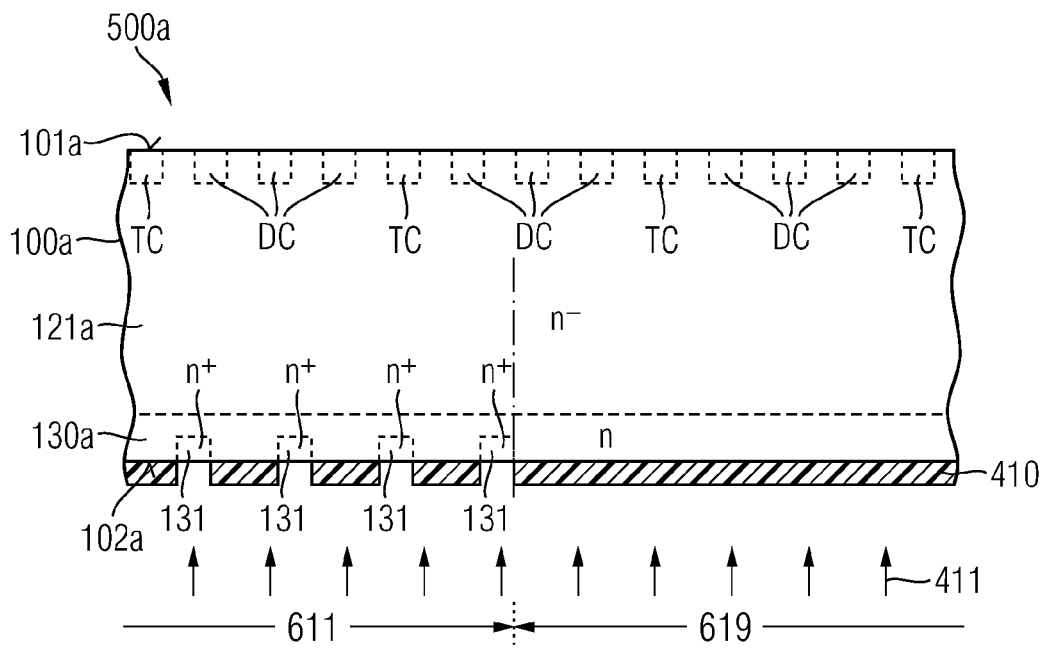
FIG. 7A is a schematic cross-sectional view of a portion of a semiconductor substrate for illustrating a method of manufacturing a reverse-conducting semiconductor device according to a further embodiment without an unmasked counter implant during a first masked implant using a first implant mask on the rear side surface.
Figure 7B:
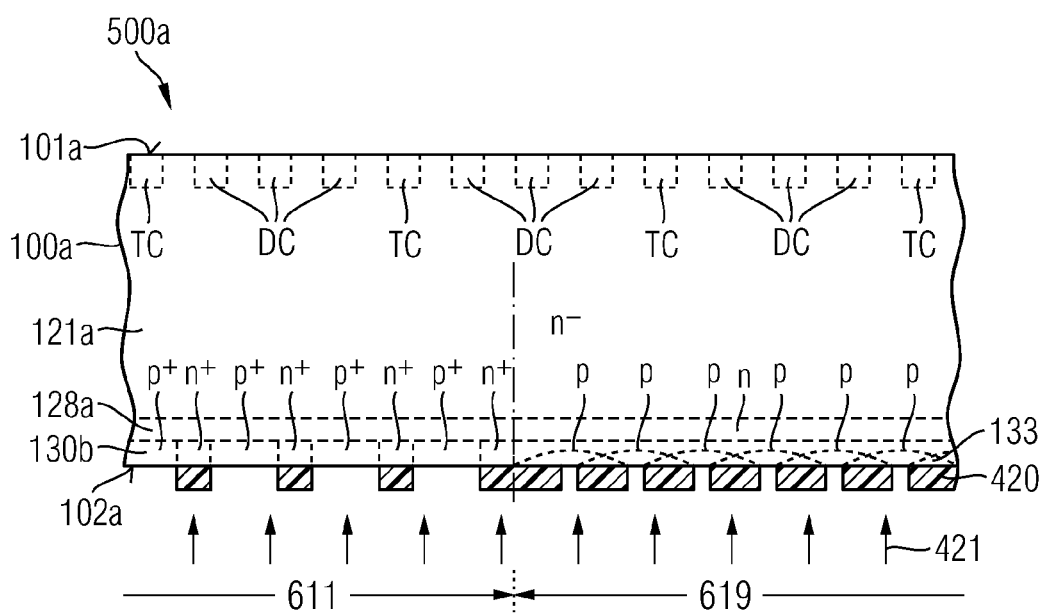
FIG. 7B is a schematic cross-sectional view of the semiconductor substrate portion of FIG. 7A during a second masked implant using a second implant mask with openings in the first region.

FIGS. 7A to 7B refer to a method of forming the patterned emitter layer by two implants.

Starting from the semiconductor substrate 500a of FIG. 6A and using a first implant mask 410 as described with reference to FIG. 6B, n-type impurities 411 are implanted through the openings in the first implant mask 410 to form the n-type first zones 131 as illustrated in FIG. 7A.

The first implant mask 410 may be replaced with a second implant mask 420 with first openings in the first region 619 and second openings exposing portions of the pedestal layer 130a between the first zones 131 in the second region 611. The first openings in the first region 619 have a lower area fraction than the second openings in the second region 611. For example, the first openings may be smaller, e.g., narrower than the second openings, or sparser, or both smaller and sparser. P-type impurities 421 are introduced through the first and second openings in the second implant mask 420, into the pedestal layer 130a.

FIG. 7B shows heavily doped p-type second zones 132 formed between the first zones 131 in the second region 611 and a continuous p-type third zone 133 with weakly doped sections and more heavily doped sections in the first region 619. The sequence of the implants may be changed.

Figure 8A:
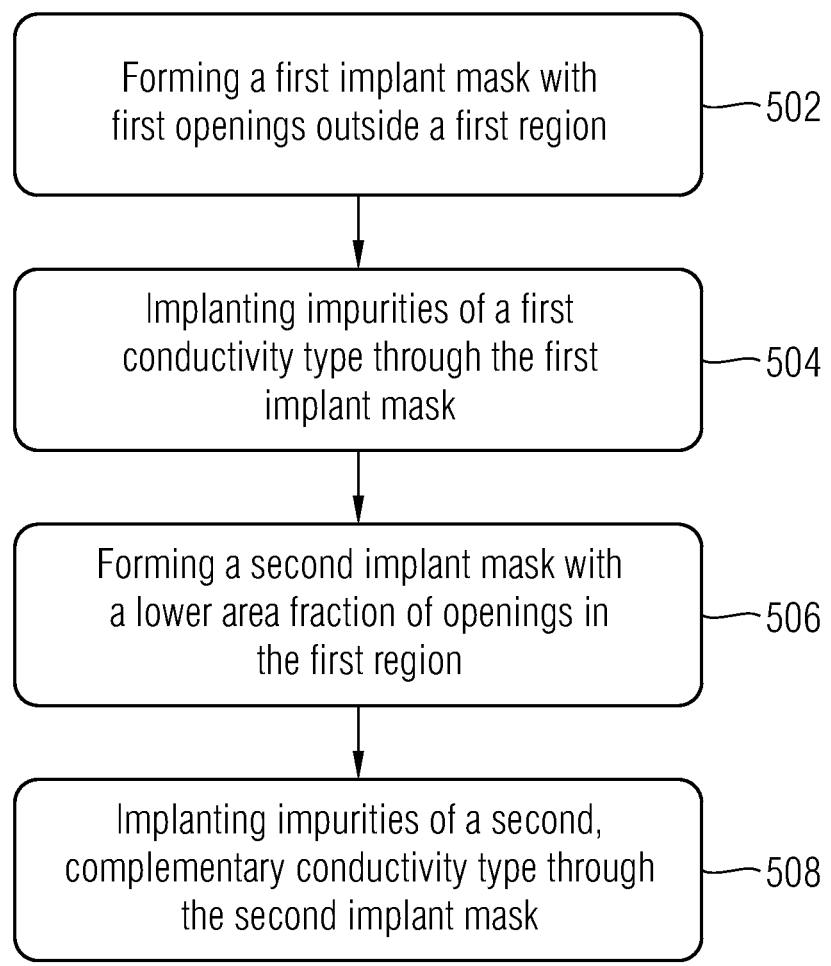
FIG. 8A is a simplified flow chart illustrating a method of manufacturing a semiconductor device according to yet a further embodiment.

FIG. 8A shows a method of manufacturing a semiconductor device. A first implant mask is formed on a rear side surface of a semiconductor substrate, wherein the first implant mask is devoid of openings in a first region and comprises openings outside the first region (502). Impurities of a first conductivity type are implanted through the first implant mask into a pedestal layer of the semiconductor substrate directly adjoining the rear side surface to form first zones of the first conductivity type in the pedestal layer (504). A second implant mask is formed on the rear side surface, wherein in the first region an area fraction of openings in the second implant mask is lower than outside the first region (506). Impurities of a complementary second conductivity type are implanted through the second implant mask into the pedestal layer to form in the pedestal layer, outside the first region, second zones of a second conductivity type separating the first zones and in the first region a contiguous third zone of the second conductivity type, wherein the third zone has a lower mean implant dose than the second zones (508).

FIG. 8B shows another method of manufacturing a semiconductor device. A first implant mask is formed on a rear side surface of a semiconductor substrate, wherein the first implant mask is devoid of openings in a first region and comprises openings in a second region outside the first region (512). Impurities of a first conductivity type are implanted through the first implant mask into a pedestal layer of the semiconductor substrate directly adjoining the rear side surface to form first zones of the first conductivity type in the pedestal layer (514). A second implant mask devoid of openings in the first region is formed on the rear side surface (516). Impurities of a complementary second conductivity type are implanted through the second implant mask into the pedestal layer to form, inside the second region, second zones of the second conductivity type separating the first zones (518). Impurities of the second conductivity type are implanted with the rear side surface exposed in both the first region and the second region (520). An annealing process may be performed after the step of implanting impurities of a complementary second conductivity type into the pedestal layer to form, inside the second region, second zones of the second conductivity type separating the first zones and before the step of implanting impurities of the second conductivity type with the rear side surface exposed in the first and second regions.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a drift zone of a first conductivity type in a semiconductor body;
   controllable cells configured to form a conductive channel connected with the drift zone in a first state; and
   first zones of the first conductivity type as well as second zones and a third zone of a complementary second conductivity type between the drift zone and a rear side electrode, respectively, wherein the third zone is wider and has a lower mean emitter efficiency than the second zones and wherein the first, second and third zones directly adjoin the rear side electrode.

2. The semiconductor device of claim 1, wherein a minimum width of the third zone is at least twice as large as a minimum distance between neighboring first zones separated by one of the second zones.

3. The semiconductor device of claim 1, further comprising:
   a field stop layer between the drift zone and an emitter layer comprising the first, second and third zones, wherein a maximum net impurity concentration in the field stop layer is at least five times as high as in the drift zone.

4. The semiconductor device of claim 1, wherein the third zone comprises at least one first zone section and a net impurity dose in the second zones is at least 1.3 times as high as in the first zone section.

5. The semiconductor device of claim 1, wherein the third zone comprises at least one first zone section and a net impurity dose in the second zones is at most six times as high as in the first zone section.

6. The semiconductor device of claim 1, wherein the third zone comprises at least one first zone section and a net impurity dose in the second zones is at least twice and at most three times as high as in the first zone section.

7. The semiconductor device of claim 4, wherein the third zone comprises second zone sections with a net impurity dose closer to the net impurity dose in the second zones than to the net impurity dose in the first zone sections.

8. The semiconductor device of claim 7, wherein the second zone sections and the second zones have equal net impurity doses.

9. The semiconductor device of claim 7, wherein the second zone sections directly adjoin the second zones.

10. The semiconductor device of claim 7, wherein at least one of the second zone sections is formed in a boundary section of the third zone, the boundary section directly adjoining one or more first zones and having a width of at most five times a sum of a mean width of the first zones and a mean width of the second zones.

11. The semiconductor device of claim 7, wherein the second zones are stripes and the second zone sections are formed in a longitudinal projection of the second zones.

12. The semiconductor device of claim 7, wherein the second zones are arranged in a matrix and the second zone sections are arranged in a regular extension of the matrix.

13. The semiconductor device of claim 1, further comprising:
a first field stop zone between the drift zone and the third zone, wherein a mean net impurity concentration in the first field stop zone is at least twice as high as in the drift zone.

14. The semiconductor device of claim 13, further comprising:
a second field stop zone between the drift zone on one side and the first and second zones on an opposite side, wherein a net impurity dose in the first field stop zone is at least twice as high as in the second field stop zone.

15. A reverse conducting insulated gate bipolar transistor, comprising:
a drift zone of a first conductivity type in a semiconductor body;
controllable cells configured to form a conductive channel connected with the drift zone in a first state; and
first zones of the first conductivity type as well as second zones and a third zone of a complementary second conductivity type between the drift zone and a rear side electrode, respectively, wherein the third zone is wider than the second zones and comprises at least one first zone section with a net impurity dose of at most 80% of the second zones and wherein the first, second and third zones directly adjoin the rear side electrode.

16. A method of manufacturing a semiconductor device, the method comprising:
forming a first implant mask on a rear side surface of a semiconductor substrate, wherein the first implant mask is devoid of openings in a first region and comprises openings outside the first region;
implanting impurities of a first conductivity type through the first implant mask into a pedestal layer of the semiconductor substrate directly adjoining the rear side surface to form first zones of the first conductivity type in the pedestal layer;
forming a second implant mask on the rear side surface, wherein in the first region an area fraction of openings in the second implant mask is lower than outside the first region; and
implanting impurities of a complementary second conductivity type through the second implant mask into the pedestal layer to form, outside the first region, second zones of the second conductivity type separating the first zones, and, inside the first region, a contiguous third zone of the second conductivity type with a lower mean implant dose than the second zones.

17. The method of claim 16, wherein the second implant mask completely covers the first region, the method further comprising:
implanting impurities of the second conductivity type with the rear side surface completely exposed.

18. The method of claim 16, wherein first openings of the second implant mask in the first region are narrower than second openings outside the first region.

19. A method of manufacturing a semiconductor device, the method comprising:
forming a first implant mask on a rear side surface of a semiconductor substrate, wherein the first implant mask is devoid of openings in a first region and comprises openings in a second region outside the first region;
implanting impurities of a first conductivity type through the first implant mask into a pedestal layer of the semiconductor substrate directly adjoining the rear side surface to form first zones of the first conductivity type in the pedestal layer;
forming a second implant mask on the rear side surface, wherein the second implant mask is devoid of openings in the first region;
implanting impurities of a complementary second conductivity type through the second implant mask into the pedestal layer to form, inside the second region, second zones of the second conductivity type separating the first zones; and
implanting impurities of the second conductivity type with the rear side surface exposed in the first region and the second region.

20. The method of claim 19, wherein before the step of implanting impurities of the second conductivity type with the rear side surface exposed in the first region and the second region and after the step of implanting impurities of a complementary second conductivity type into the pedestal layer to form, inside the second region, second zones of the second conductivity type separating the first zones
an annealing process is performed.

* * * * *

UNITED STATES PATENT AND TRADEMARK OFFICE
CERTIFICATE OF CORRECTION

PATENT NO. : 9,159,819 B2
APPLICATION NO. : 14/185117
DATED : October 13, 2015
INVENTOR(S) : Frank Pfirsch et al.

It is certified that error appears in the above-identified patent and that said Letters Patent is hereby corrected as shown below:

Column 2, line 18 (title page, other publications) please change "21st Internationl" to -- 21st International --

Signed and Sealed this
Fifth Day of April, 2016

Michelle K. Lee
*Director of the United States Patent and Trademark Office*